United States Patent
Stella (10) Patent No.: US 8,723,311 B2
(45) Date of Patent: May 13, 2014

(54) HALF-BRIDGE ELECTRONIC DEVICE WITH COMMON HEAT SINK ON MOUNTING SURFACE

(75) Inventor: Cristiano Gianluca Stella, San Gregorio di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 15 days.

(21) Appl. No.: 13/536,092

(22) Filed: Jun. 28, 2012

(65) Prior Publication Data
US 2013/0003305 A1    Jan. 3, 2013

(30) Foreign Application Priority Data
Jun. 30, 2011   (IT) .............. MI2011A1215

(51) Int. Cl.
*H01L 23/10*    (2006.01)
*H01L 23/495*    (2006.01)

(52) U.S. Cl.
USPC ............ 257/707; 257/675; 257/678; 257/706

(58) Field of Classification Search
None
See application file for complete search history.

(56) References Cited

U.S. PATENT DOCUMENTS

| | | | |
|---|---|---|---|
| 5,504,652 | A | 4/1996 | Foster et al. |
| 6,150,254 | A | 11/2000 | Kito |
| 6,833,997 | B1 | 12/2004 | Jones, III et al. |
| 7,145,224 | B2 * | 12/2006 | Kawashima et al. ......... 257/678 |
| 8,062,932 | B2 | 11/2011 | Hebert et al. |
| 8,358,017 | B2 * | 1/2013 | Tsui .............................. 257/778 |
| 8,390,041 | B2 | 3/2013 | Yoshimochi |
| 8,481,368 | B2 * | 7/2013 | Xue et al. ...................... 438/113 |
| 8,604,611 | B2 * | 12/2013 | Hauenstein ................... 257/724 |
| 2005/0161785 | A1 * | 7/2005 | Kawashima et al. ......... 257/678 |
| 2006/0091512 | A1 | 5/2006 | Shinohara |
| 2007/0090523 | A1 | 4/2007 | Otremba |

(Continued)

FOREIGN PATENT DOCUMENTS

| | | |
|---|---|---|
| JP | 49047567 U | 4/1974 |
| JP | 58218149 A | 12/1983 |

(Continued)

OTHER PUBLICATIONS

Italian Search Report and Written Opinion for IT MI2011A001215 mailed Mar. 6, 2012 (7 pages).

*Primary Examiner* — Julio J Maldonado
*Assistant Examiner* — Harpreet Singh
(74) *Attorney, Agent, or Firm* — Gardere Wynne Sewell LLP (57) ABSTRACT

A device includes a first switch and a second switch, each switch being integrated on a chip having a back surface and an opposite front surface. Each chip includes a first conduction terminal and a control terminal on the front surface, while a second conduction terminal of the switch is located on the back surface. The first switch and the second switch are connected in a half-bridge configuration with the first switch's second conduction terminal electrically connected to the second switch's first conduction terminal. The chips are installed in a common package comprising an insulating body with an embedded heat sink. The chips of the switches are mounted on the heat sink such that the second conduction terminal of the first switch and the first conduction terminal of the second switch are in contact with the heat sink, with the heat sink providing the electrical connection between the two switches.

24 Claims, 9 Drawing Sheets

(56) References Cited

U.S. PATENT DOCUMENTS

2007/0108564 A1  5/2007  Tang et al.
2008/0054422 A1  3/2008  Koike et al.
2010/0133674 A1* 6/2010  Hebert et al. ............. 257/686
2011/0096509 A1* 4/2011  Yoshimochi ............... 361/728
2013/0003305 A1  1/2013  Stella

FOREIGN PATENT DOCUMENTS

| JP | 62104056 A | 5/1987 |
| JP | 4368155 A | 12/1992 |
| JP | 6037217 A | 2/1994 |
| JP | 8078584 A | 3/1996 |
| WO | WO-2006058030 A2 | 6/2006 |

\* cited by examiner

HALF-BRIDGE ELECTRONIC DEVICE WITH COMMON HEAT SINK ON MOUNTING SURFACE

PRIORITY CLAIM

This application claims priority from Italian Application for Patent No. MI2011A001215 filed Jun. 30, 2011, the disclosure of which is incorporated by reference.

TECHNICAL FIELD

The solution according to one or more embodiments relates to the field of electronics. More specifically, this solution relates to electronic devices.

BACKGROUND

Electronic devices are commonly used in several applications. In the particular case of power electronic devices, they are constructed so as to be able to withstand an operation power of relatively high value (for example, of the order of 100-625 W).

The electronic devices are generally integrated on chips of semiconductor material. Each chip is then housed into a proper package, which protects the chip at the same time allowing the access to its terminals. The package comprises an insulating body that embeds the chip. The insulating body exposes several leads, each one of them being connected electrically to a correspondent terminal of the chip. Typically, the lead is connected to the terminal of the chip with a wire-bonding technique, wherein a conductive wire is fastened at an end thereof on the lead and at another end thereof on the terminal of the chip. The leads of the package are used to connect the same (and then the corresponding terminals of the chip) to external circuits. For this purpose, the electronic device is generally mounted on a Printed Circuit Board (PCB). For example, in the Surface-Mount Technology (SMT) the leads are provisionally attached, by means of solder pastes, to corresponding conductive tracks of the printed circuit board through a light pressure (pick and place), and they are then soldered by reflow thereon.

The power electronic devices are subject to remarkable heating during their operation (since they are affected by high currents and/or voltages, of the order of 50-1,500V and 0.1-8A, respectively). Therefore, the package of every power electronic device is generally provided with a heat sink, which has a wide surface exposed on a surface for mounting the insulating body on the printed circuit board; the chip is fastened on the heat sink, so as to facilitate the transfer of the heat produced by it to the outside of the package (so as to reduce the thermal resistance of the electronic device from its chip to the external atmosphere). The heat sink may also be connected electrically to a terminal of the electronic device integrated on the chip, so as to act as a corresponding lead as well—for example, when the electronic device has a vertical structure with such terminal made on a back surface of the chip that is fastened on the heat sink (while the other terminals of the chip, made on a front surface thereof, are connected to the corresponding leads through conductive wires).

A typical application of the power electronic devices is in switching systems. A generic switching system comprises one or more pairs of power electronic switches (for example, power transistors of MOS type); every pair of power transistors is connected in a half-bridge configuration, wherein the transistors are arranged in series (in order to be connected between a reference terminal, or ground, and a power supply terminal), with a common node thereof that defines an output terminal for the connection of a load. The power transistors are turned on and turned off alternatively (with a short dead time at every switching wherein they are both off).

The power transistors are generally integrated on distinct chips (because of either technical or economic reasons), which chips are then housed in corresponding packages. Therefore, the switching system comprises a distinct package for each power transistor, which is mounted separately on the printed circuit board (which implements the desired electrical connection between the different power transistors).

However, the known structures of the switching systems are not completely satisfactory—for example, with respect to their size, to their constructive complexity, and to their thermal dissipation effectiveness.

SUMMARY

In its general terms, the solution according to one or more embodiments is based on the idea of housing each pair of transistors (or more generally electronic switches) into a single package, by exploiting the heat sink on the mounting surface for their electrical connection.

Particularly, one or more aspects of the solution according to specific embodiments are set out in the independent claims, with advantageous features of the same solution that are set out in the dependent claims, whose wording is herein incorporated verbatim by reference (with any advantageous feature provided with reference to a specific aspect of the solution according to an embodiment of the invention that applies mutatis mutandis to every other aspect thereof).

More specifically, an aspect of the solution according to an embodiment provides an electronic device (for example, for use in a switching system). The electronic device comprises a first electronic switch and a second electronic switch (for example, a low-side transistor and a high-side transistor of NMOS type). Each electronic switch is integrated on a chip having a back surface and a front surface opposite to each other; the chip comprises a first conduction terminal (for example, a source terminal) and a control terminal (for example, a gate terminal) of the corresponding electronic switch on the front surface, and a second conduction terminal (for example, a drain terminal) of the corresponding electronic switch on the back surface. The first electronic switch and the second electronic switch are connected in a half-bridge configuration, with the second conduction terminal of the first electronic switch connected to the first conduction terminal of the second electronic switch (for example, the drain terminal of the low-side transistor connected to the source terminal of the high-side transistor).

In the solution according to an embodiment, the electronic device comprises a common package comprising an insulating body; the insulating body has a mounting surface for mounting the package on a substrate (for example, a printed circuit board). The insulating body embeds the first electronic switch and the second electronic switch. The package comprises a heat sink, which is embedded in the insulating body with a portion exposed therefrom on the mounting surface. The chip of the first electronic switch and the chip of the second electronic switch are mounted on the heat sink in correspondence to the back surface and to the front surface, respectively (for example, with the chip of the high-side transistor turned upside down); the second conduction terminal of the first electronic switch and the first conduction terminal of the second electronic switch contact the heat sink so as to be connected electrically therebetween through the heat sink.

A further aspect of the solution according to an embodiment provides a switching system comprising one or more of such electronic devices.

A still further aspect of the solution according to an embodiment provides a complex system comprising one or more of such switching systems.

A different aspect of the solution according to an embodiment provides a corresponding method for producing the electronic device.

BRIEF DESCRIPTION OF THE DRAWINGS

The solution according to one or more embodiments, as well as further features and the advantages thereof, will be best understood with reference to the following detailed description, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessary drawn to scale (with some details that may be exaggerated and/or simplified) and that, unless otherwise indicated, they are merely used to conceptually illustrate the structures and procedures described herein. Particularly.

DETAILED DESCRIPTION OF THE DRAWINGS

Figure 1:
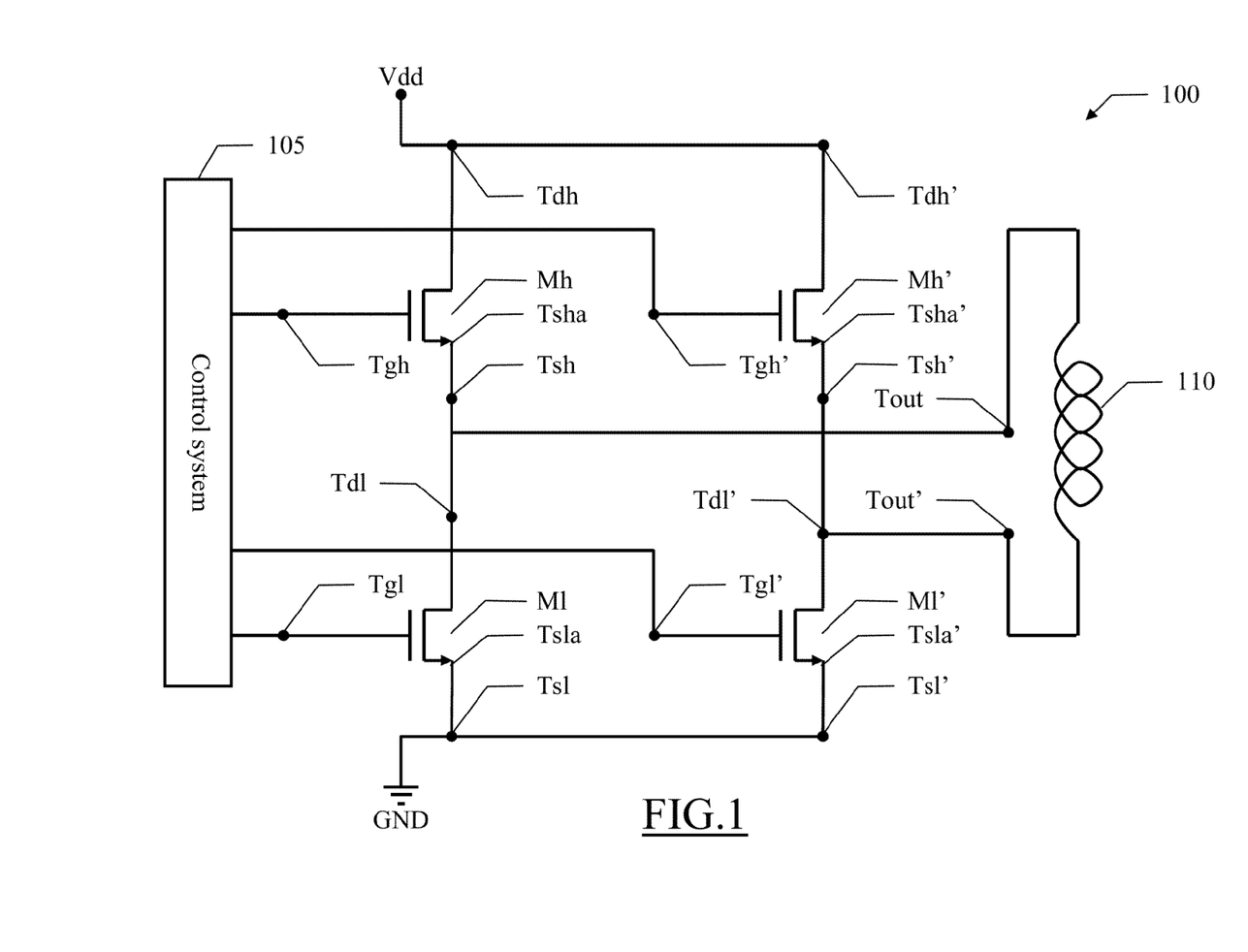
FIG. 1 shows a principle circuit scheme of a switching system wherein the solution according to an embodiment may be used.

With reference in particular to the FIG. 1, a principle circuit scheme is shown of a switching system 100 wherein the solution according to an embodiment may be used.

The switching system 100 has a full-bridge structure, with two circuit branches each one formed by a low-side transistor Ml, Ml' and a high-side transistor Mh, Mh' (both of them of power NMOS type), which are connected to each other in a half-bridge configuration (with each low-side transistor Ml, Ml' equal to the corresponding high-side transistor Mh, Mh').

In each half-bridge, a source terminal Tsl, Tsl' of the low-side transistor Ml, Ml' is connected to a ground terminal GND (which receives a reference voltage, or ground), while a drain terminal Tdh, Tdh' of the high-side transistor Mh, Mh' is connected to a power-supply terminal Vdd (which receives a direct power-supply voltage—for example, 600-900V with respect to the ground voltage). A drain terminal Tdl, Tdl' of the low-side transistor Ml, Ml' and a source terminal Tsh, Tsh' of the high-side transistor Mh, Mh' are connected to each other, so as to define a corresponding output terminal Tout, Tout' of the half-bridge Ml-Mh, Ml'-Mh'.

A gate terminal Tgl, Tgh, Tgl' and Tgh' of each (low-side and high-side) transistor Ml, Mh, Ml' and Mh', respectively, is connected to a control system 105. A load 110 (for example, of inductive type) is connected between the output terminals Tout and Tout'. The control system 105 drives the transistors Ml, Mh, Ml' and Mh' so that each pair formed by the low-side transistor Ml, Ml' of a half-bridge and by the high-side transistor Mh, Mh' of the other half-bridge (i.e., Ml, Mh' and Ml', Mh) is turned on and turned off alternatively (with a short dead time at every switching wherein both the pairs of transistors Ml, Mh' and Ml', Mh are turned off to avoid any risks of cross-conduction with the creation of a short circuit between the ground terminal GND and the power-supply terminal Vdd).

Each transistor Ml, Mh, Ml' and Mh' may also be provided with an auxiliary source terminal Tsla, Tsha, Tsla' and Tsha', respectively; the auxiliary source terminal Tsla, Tsha, Tsla', Tsha' is used by the same control system 105 (whose connections are not shown in the figure for the sake of representation simplicity) to turn on or to turn off the transistor Ml, Mh, Ml', Mh' in alternative mode—so as to reduce stray inductive effects due to the bonding of its terminals, through differentiated conductive paths for the main source current and for the control of the gate-source voltage.

Figure 2:
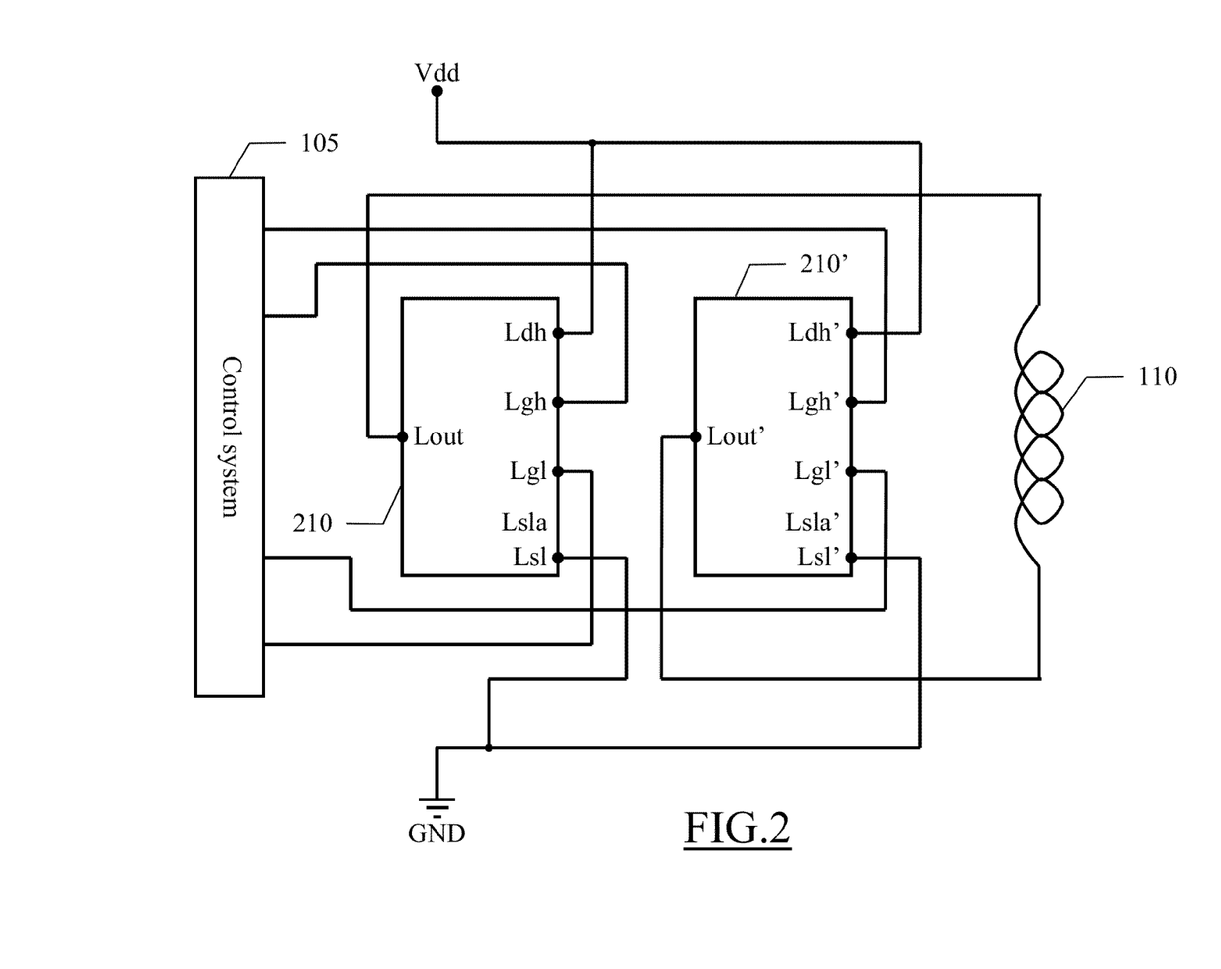
FIG. 2 shows an implementation of such switching system according to an embodiment.

An implementation of such switching system 100 according to an embodiment is shown in the FIG. 2.

In this case, in every half-bridge the low-side transistor and the high-side transistor (not shown in the figure) are made as a single electronic device 210, 210; the electronic device 210,210' is provided with a (main) source lead Lsl, Lsl' (electrically connected to the source terminal of the low-side transistor), an auxiliary source lead Lsla, Lsla' (electrically connected to the auxiliary source terminal of the low-side transistor), a drain lead Ldh, Ldh' (electrically connected to the drain terminal of the high-side transistor), a gate lead Lgl,Lgl' and another gate lead Lgh, Lgh' (electrically connected to the gate terminal of the low-side transistor and to the gate terminal of the high-side transistor, respectively), and an output lead Lout, Lout' (electrically connected to the output terminal of the half-bridge).

Figure 3:
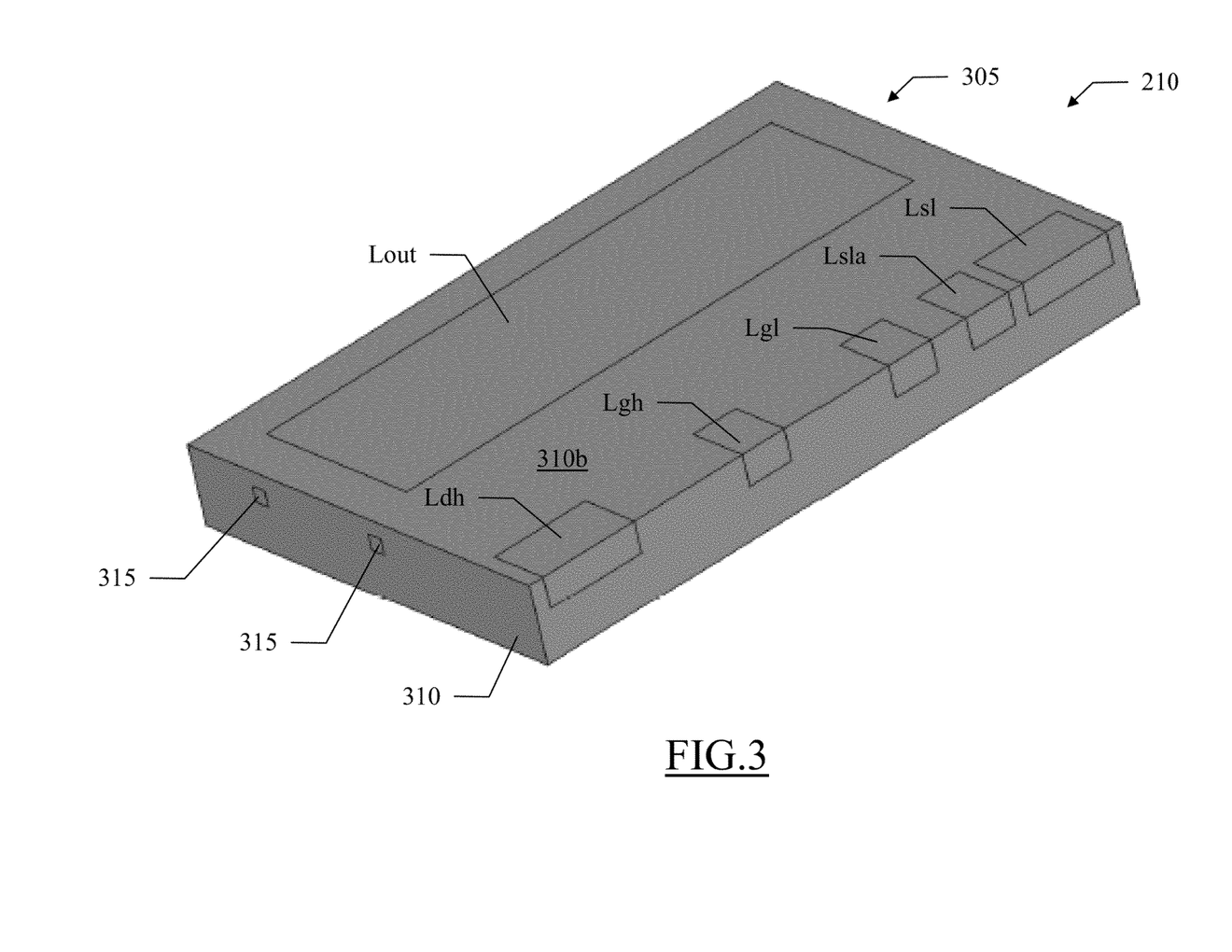
FIG. 3 shows an overall schematic representation of an electronic device according to an embodiment that may be used in such switching system.

An overall schematic representation of an electronic device according to an embodiment that may be used in such switching system in shown in the FIG. 3; particularly, the figure shows a perspective view of the electronic device 210 being turned upside down (similar considerations apply to the other electronic device).

The electronic device 210 comprises a package 305, which protects the low-side transistor and the high-side transistor (not shown in the figure) at the same time allowing the access to their terminals. The package 305 is formed by an electrically insulating body 310 (for example, of plastic material), of generically parallelepiped shape, which embeds the low-side transistor and the high-side transistor (for example, with a width of 6-10 mm, a length of 10-20 mm, and a height of 0.8-2 mm-like 8 mm, 14.9 mm and 1 mm, respectively). The insulating body 310 exposes the leads Lsl, Lsla, Ldh, Lgl, Lgh and Lout, each one of them being made of electrically conductive material (for example, of metallic material). Particularly, the output lead Lout is formed by a pad of generically rectangular shape (which also acts as a heat sink, as described in the following) extending approximately over a third of a (back) mounting surface 310b of the insulating body 310 (behind in the figure). The leads Lsl, Lsla, Lgl, Lgh and Ldh are instead distributed uniformly along an edge of the mounting surface 310b opposite the output lead Lout (in front in the figure);

each lead Lsl, Lsla, Lgl, Lgh and Ldh is formed by a pad of generically square shape extending partially on the mounting surface 310b and partially on a side surface of the insulating body 310 adjacent thereto. The insulating body 310 also exposes the free ends of electrically conductive tie-bars 315 (for example, of metallic material), which are used to support the output lead Lout during the making of the package 305 and are cut after the molding of the insulating body 310 (electrically connected to the output lead Lout). The tie-bars 315 are arranged in pairs on the other side surfaces of the insulating body 310 where the leads Lsl, Lsla, Lgl, Lgh and Ldh are not present (only visible on the left in the figure). The package 305 is of the SMT type—i.e., adapted to be mounted on a printed circuit board (not shown in the figure) with its mounting surface 310b rested thereon, and the leads Lsl, Lsla, Lgl, Lgh, Ldh and Lout soldered on corresponding conductive tracks.

The leads Lsl, Lsla, Ldh, Lgl, Lgh, Lout and the tie-bars 315 are properly spaced apart among them so as to guarantee the correct creepage distance along the insulating body 310. For example, the creepage distances are equal to 1 mm between the gate lead Lgl and the auxiliary source lead Lsla, 2.7 mm between the gate lead Lgl and the gate lead Lgh, 2.7 mm between the gate lead Lgh and the drain lead Ldh, and 2 mm between the leads Lsl, Lsla, Ldh, Lgl, Lgh and the output lead Lout (and the tie-bars 315), with the source lead Lsl and the auxiliary source lead Lsla that are spaced apart between them by 0.5 mm (even if such values are purely indicative and in no way limitative).

Figure 4A:
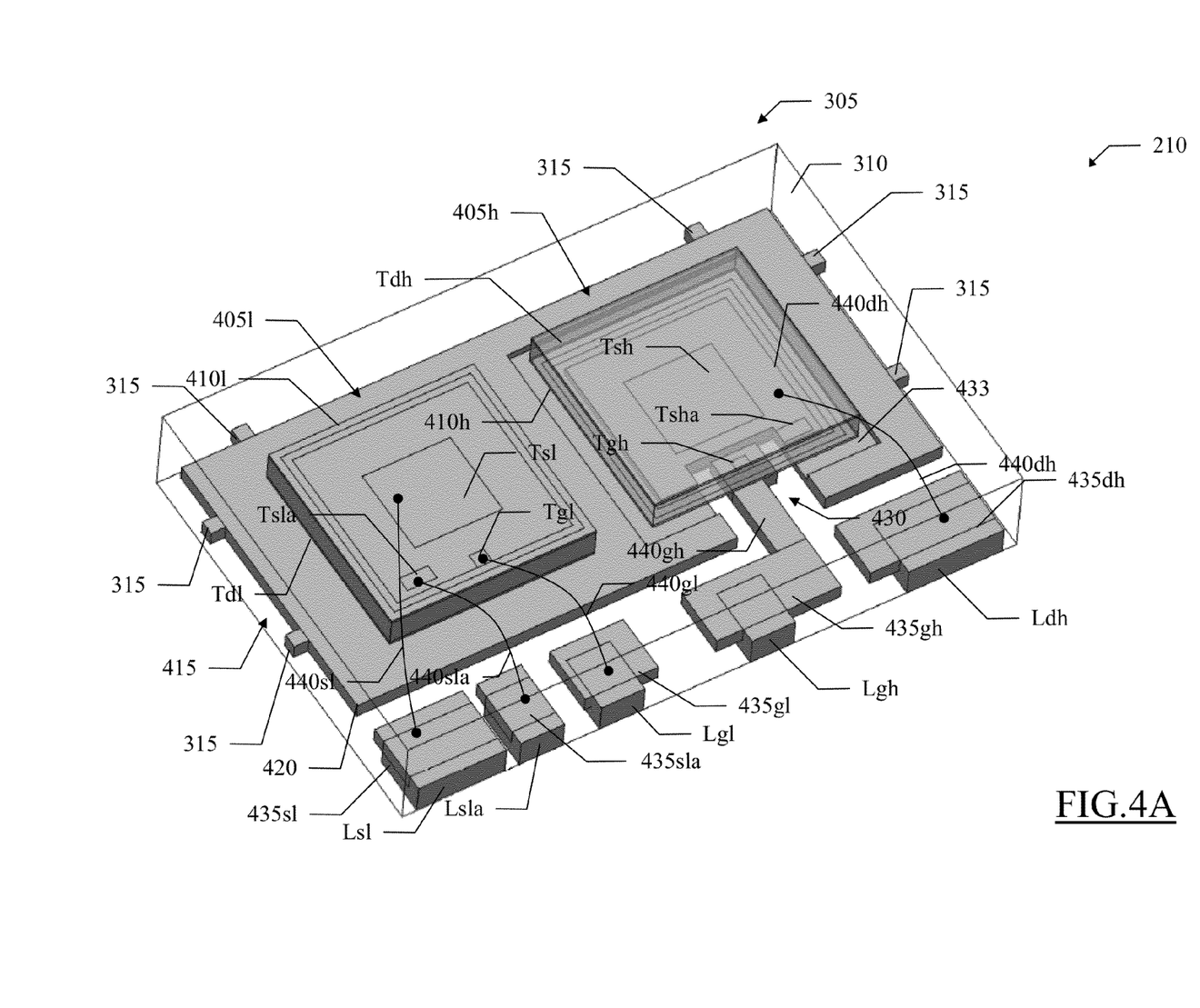
FIG. 4A-FIG. 4B show a phantom perspective view from the top and from the bottom, respectively, of such electronic device according to an embodiment.
Figure 4B:
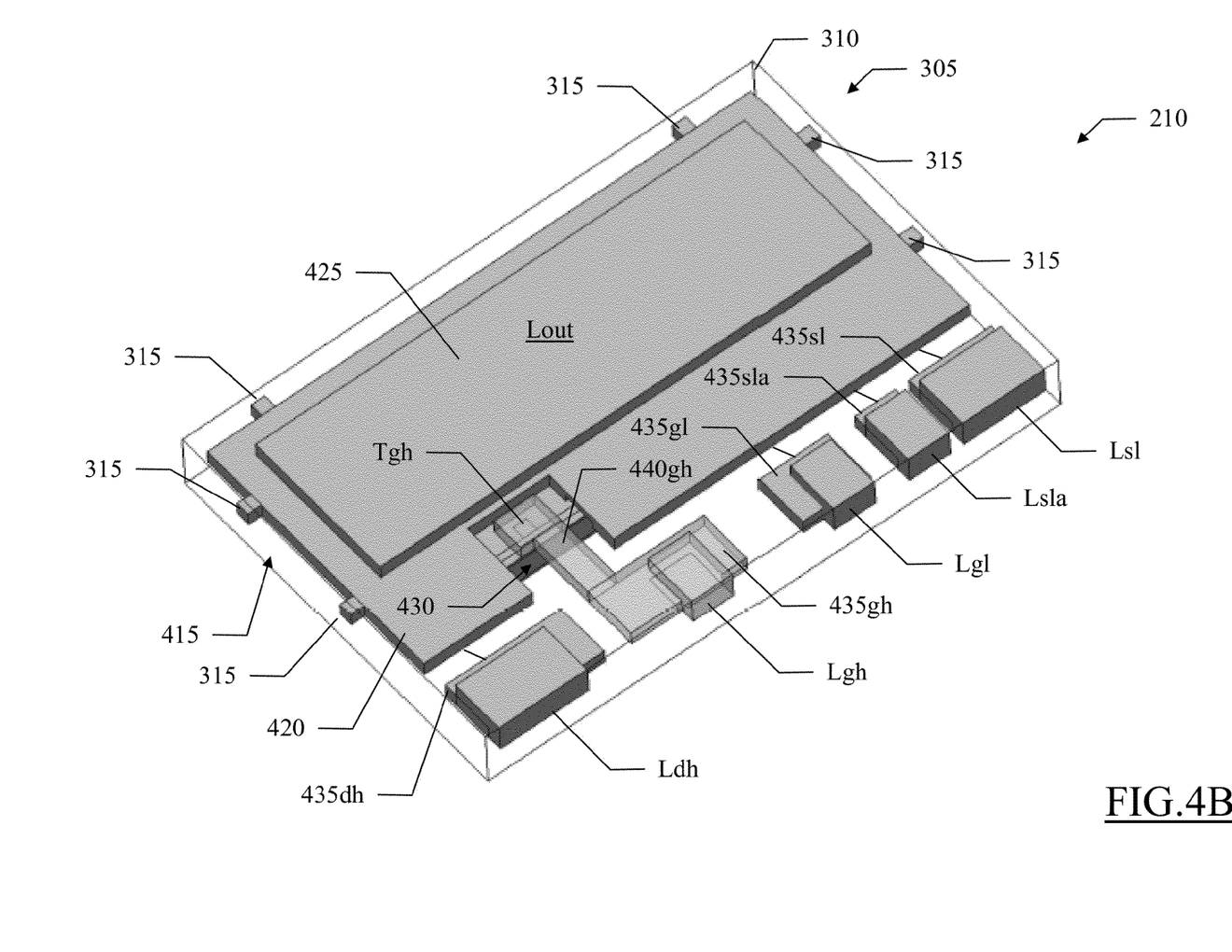

Passing to FIG. 4A-FIG. 4B, there is shown a phantom perspective view from the top and from the bottom, respectively, of the electronic device 210 according to an embodiment.

With reference in particular to the FIG. 4A, the low-side transistor and the high-side transistor are integrated on a chip of semiconductor material 405l and 405h, respectively, on which the terminals Tsl, Tsh, Tsla, Tsha, Tgl, Tgh and Tdl, Tdh of the corresponding transistor are arranged—made of electrically conductive material (for example, of metallic material). Particularly, the drain terminal Tdl, Tdh extends on a whole back surface of the chip 405l, 405h. A front surface of the chip 405l, 405h (opposite its back surface) is instead covered by an insulating layer 410l, 410h. A tap defining the source terminal Tsl, Tsh, a tap defining the auxiliary source terminal Tsla, Tsha, and a tap defining the gate terminal Tgl, Tgh of the corresponding transistor are exposed from the insulating layer 410l, 410h on the front surface of the chip 405l, 405h. The source terminal Tsl, Tsh has a generically rectangular shape, and it is arranged approximately at the center of the front surface of the chip 405l, 405h. The auxiliary source terminal Tsla, Tsha is formed by a (smaller) distinct pad, at the side of the source terminal Tsl, Tsh towards the leads Lsl, Lsla, Lgl, Lgh, Ldh. The gate terminal Tgl, Tgh instead comprises a frame arranged close to an edge of the front surface 405l, 405h of the chip 405l, 405h (so as to surround the source terminal Tsl, Tsh and the auxiliary source terminal Tsla, Tsha) and a connection pad expanding from such frame inwards in correspondence to the center of a segment thereof facing the leads Lsl, Lsla, Lgl, Lgh, Ldh.

The electronic device 210 further comprises a thermally and electrically conductive (main) heat sink 415 (for example, of metallic material), on which the chips 405l and 405h are fastened. The heat sink 415 is formed by a plate 420 of generically rectangular shape (slightly smaller than the insulating body 310), from which the tie-bars 315 project laterally. As shown in the FIG. 4B, the heat sink 415 also comprises a splint 425 that projects from the plate 420 downwards (from the opposite side of the chips 405l, 405h); the splint 425 extends approximately over a half of the plate 420 (on the left in the figure). The heat sink 415 is completely embedded in the insulating body 310, with the exception of a free surface of its splint 425, which is exposed to define the output lead Lout (so as to offer a large surface for the transfer of the heat produced by the chips to the outside, but at the same time guaranteeing a good adhesion of the insulating body 310 to the heat sink 415).

Returning to the FIG. 4A, in the solution according to an embodiment the chip 405l is mounted normally on the heat sink 415 in correspondence to its back surface, so that the drain terminal Tdl is fastened thereto (for example, soldered on the plate 420). The chip 405h is instead mounted turned upside down on the heat sink 415 in correspondence to its front surface, so that the source terminal Tsh (and the auxiliary source terminal Tsha as well) is fastened thereto (for example, soldered on the plate 420). In this way, the drain terminal Tdl and the source terminal Tsh are electrically connected between them (and to the output lead Lout) through the heat sink 415 (which then defines a double island for both the chip 405l and the chip 405h).

The above-described structure allows housing both the low-side transistor and the high-side transistor in a single package 305, so as to obtain a very compact structure. This considerably reduces the size of the half-bridge formed by such transistors, with a corresponding size reduction of the entire switching system. Moreover, in this way the construction of the half-bridge is also simplified, with a consequent reduction of its production cost. The heat sink 415 so extended to mount both the chips 405l and 405h has a wide single surface exposed from the insulating body that also improves the thermal dissipation efficiency of the electronic device 210, and then its performance.

In the particular embodiment shown in the figures, the plate 420 has a lateral hollow 430, which extends from a longitudinal edge of the plate 420 facing the leads Lsl, Lsla, Lgl, Lgh, Ldh (opposite the gate lead Lgh) up to near the splint 425 (see FIG. 4B); a portion of the gate terminal Tgh (comprising its connection pad and a small part of its frame) is arranged in correspondence to the hollow 430, so that such portion of the gate terminal Tgh is insulated from the plate 420. Moreover, a groove 433 is formed over the plate 420 (facing the chip 405h); the groove 433 has a generically rectangular shape, interrupted by the hollow 430, with an outer size larger than the largest gate terminal Tgh and the largest chip 405h that may be mounted on the plate 420 and an inner size smaller than the smallest gate terminal Tgh that may be mounted on the plate 420. In this way, the groove 433 extends around a remaining portion of the gate terminal Tgh (comprising most of its frame), so that such portion of the gate terminal Tgh as well is insulated from the plate 420. Consequently, the entire gate terminal Tgh is insulated from the heat sink 415 (and then from the drain terminal Tdl and from the source terminal Tsh). The above-described structure of the heat sink 415 (i.e., extended with hollow) allows maintaining the heat sink 415 as wide as possible (further improving the thermal dissipation efficiency), nevertheless guaranteeing the correct electrical operation of the electronic device 210.

For each lead Lsl, Lsla, Lgl, Lgh and Ldh, the package 305 further comprises a socket 435sl, 435sla, 435gl, 435gh and 435dh, respectively, of electrically conductive material (for example, of metallic material). The socket 435sl, 35sla, 435gl, 435gh, 435dh is formed by a generically parallelepiped-shaped base, whose outer (back and side) surfaces are exposed from the insulating body 310 to define the lead Lsl, Lsla, Lgl, Lgh, Ldh; the socket 435sl, 435sla, 435gl, 435gh, 435*dh* also comprises a platform extending inwards the insulating body 310, flush with a top surface of the base (at the level of a top surface of the plate 420), so as to define a corresponding connection pad. For each one of the leads Lsl, Lsla, Lgl and Ldh, one or more connection wires 440*sl*, 404*sla*, 440*gl* and 440*dh*, respectively, are fastened (for example, soldered) at an end thereof on the respective terminal Tsl, Tsla, Tgl, Tdh and at another end thereof on the connection pad of the respective socket 435*sl*, 435*sla*, 435*gl*, 435*dh* (so as to electrically connect the terminal Tsl, Tsla, Tgl, Tdh to the lead Lsl, Lsla, Lgl, Ldh). In the case of the gate lead Lgh, instead, a cantilever 440*gh* of electrically conductive material (for example, of metallic material) extends from the platform of the corresponding socket 435*gh* (maintaining the same thickness) inside the hollow 430; the cantilever 440*gh* has an enlarged free end (that defines a corresponding connection pad, even with a reduced thickness), which surrounds the connection pad of the gate terminal Tgh (sees FIG. 4B). The connection pad of the cantilever 440*gh* is directly fastened (for example, soldered) on the connection pad of the gate terminal Tgh (so as to electrically connect the gate terminal Tgh to the gate lead Lgh). This allows accessing the gate terminal Tgh in a simple and effective way (for its connection to the gate lead Lgh) even with the extended with hollow structure of the heat sink 415.

Figure 5:
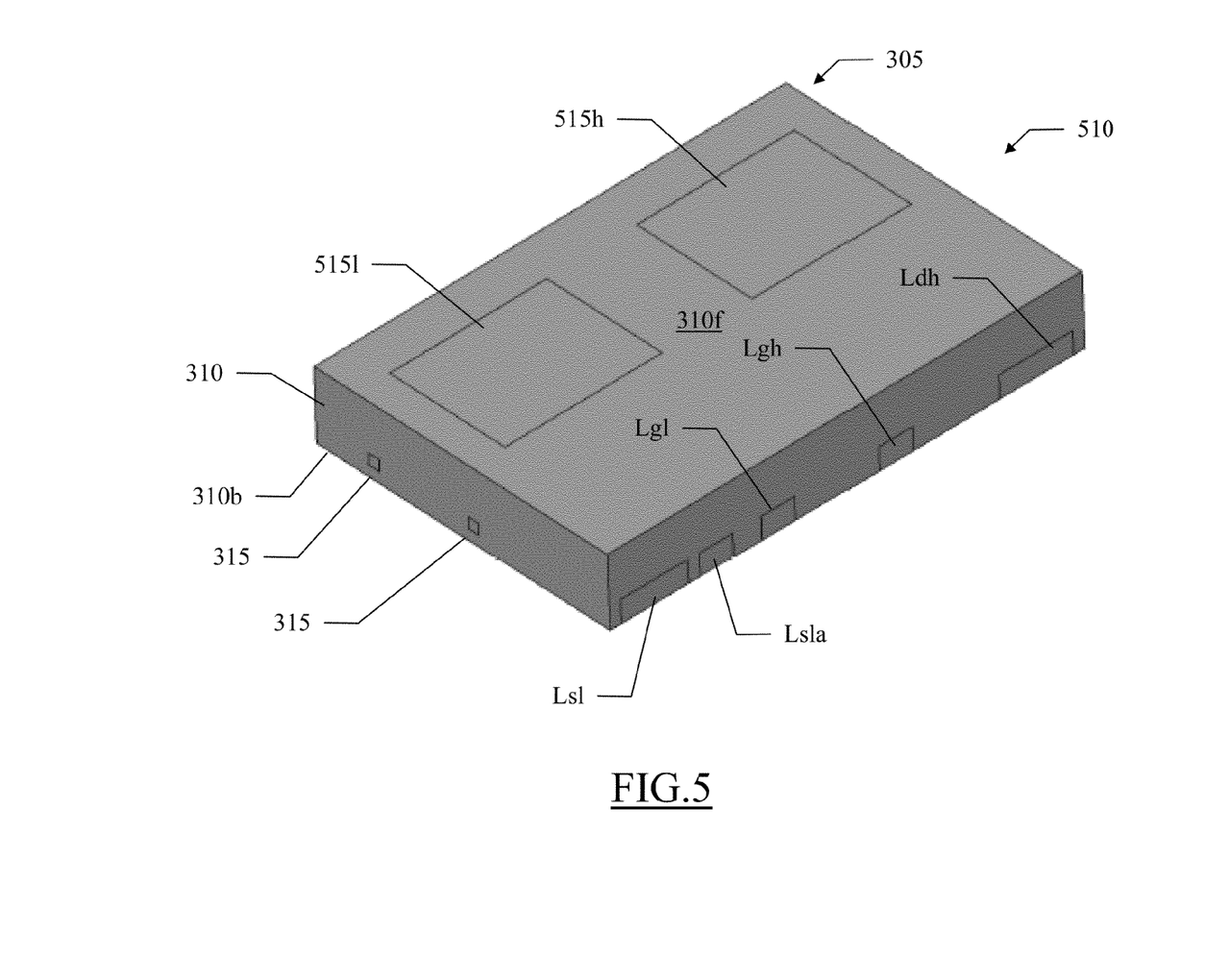
FIG. 5 shows a schematic overall representation of an electronic device according to another embodiment that may be used in the same switching system.

A schematic overall representation of an electronic device 510 according to another embodiment that may be used in the same switching system in shown in the FIG. 5.

In such case, the electronic device 510 is of the Dual Side Cool (DSC) type. Particularly, the package 305 comprises two (auxiliary) heat sinks 515*l* and 515*h* made of thermally and electrically conductive material (for example, of metallic material), which are mounted on the chip of the low-side transistor and on the chip of the high-side transistor, respectively (not visible in the figure); the heat sinks 515*l* and 515*h* have corresponding surfaces with generically rectangular shape being exposed from the insulating body 310 on a (front) free surface 310*f* thereof, opposite the mounting surface 310*b* (on the left and on the right, respectively, in the figure)—for example, for the fastening of corresponding external radiators (not shown in the figure). As described in detail in the following, the heat sink 515*l* is electrically connected to the source lead Lsl, and the heat sink 515*h* is electrically connected to the drain lead Ldh; therefore, the exposed surfaces of the heat sinks 515*l* and 515*h* as well are properly spaced apart between them (and from the leads Lsl, Lsla, Lgl, Lgh, Ldh, Lout and the tie-bars 315) so as to guarantee the correct creepage distance along the insulating body 305 (for example, 3-4 mm).

The heat sinks 515*l* and 515*h* further improve of thermal dissipation efficiency of the electronic device 510, and therefore its performance.

Figure 6A:
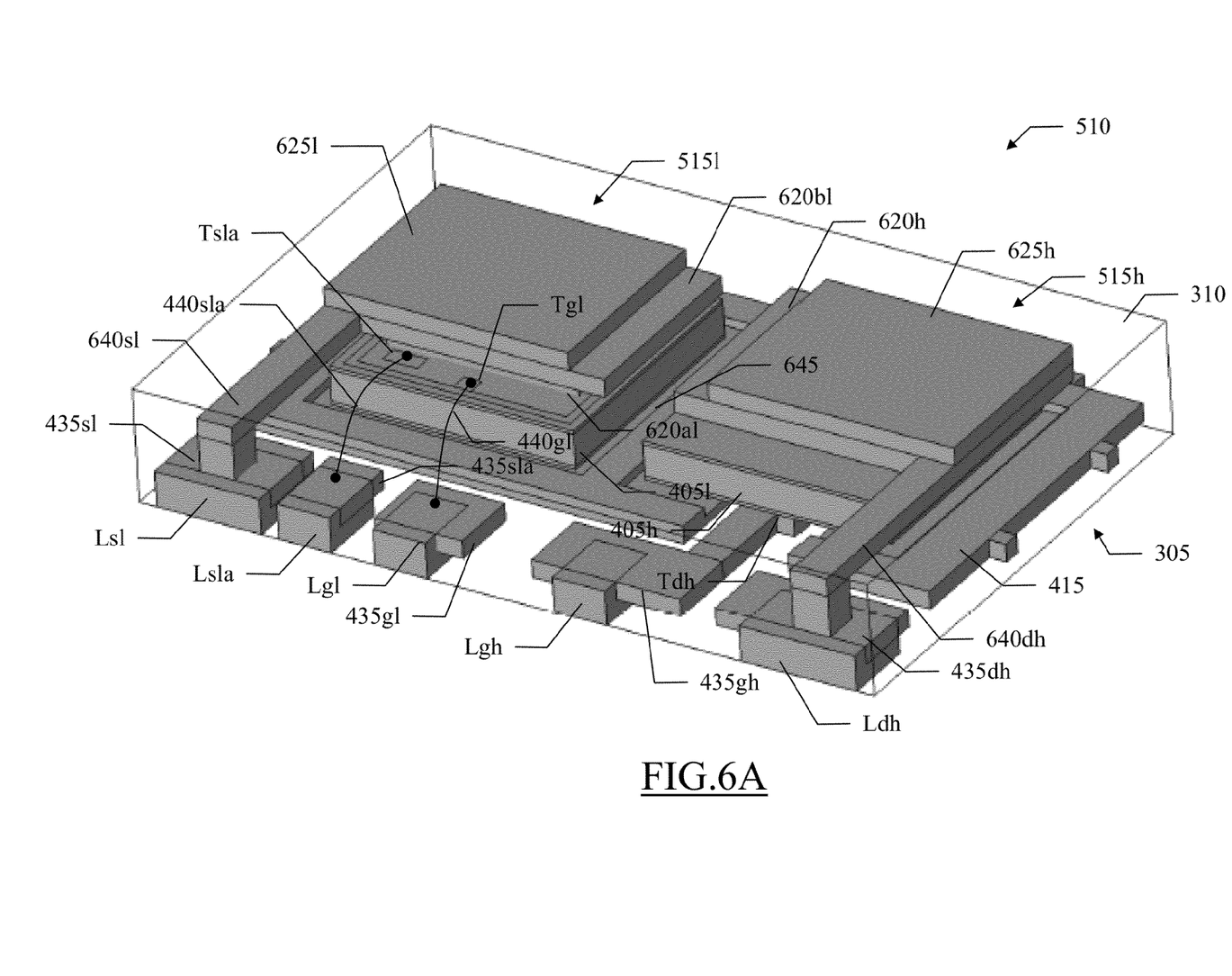
FIG. 6A-FIG. 6B show a phantom perspective view from the top and a partial cross-section side view, respectively, of such electronic device according to an embodiment.
Figure 6B:
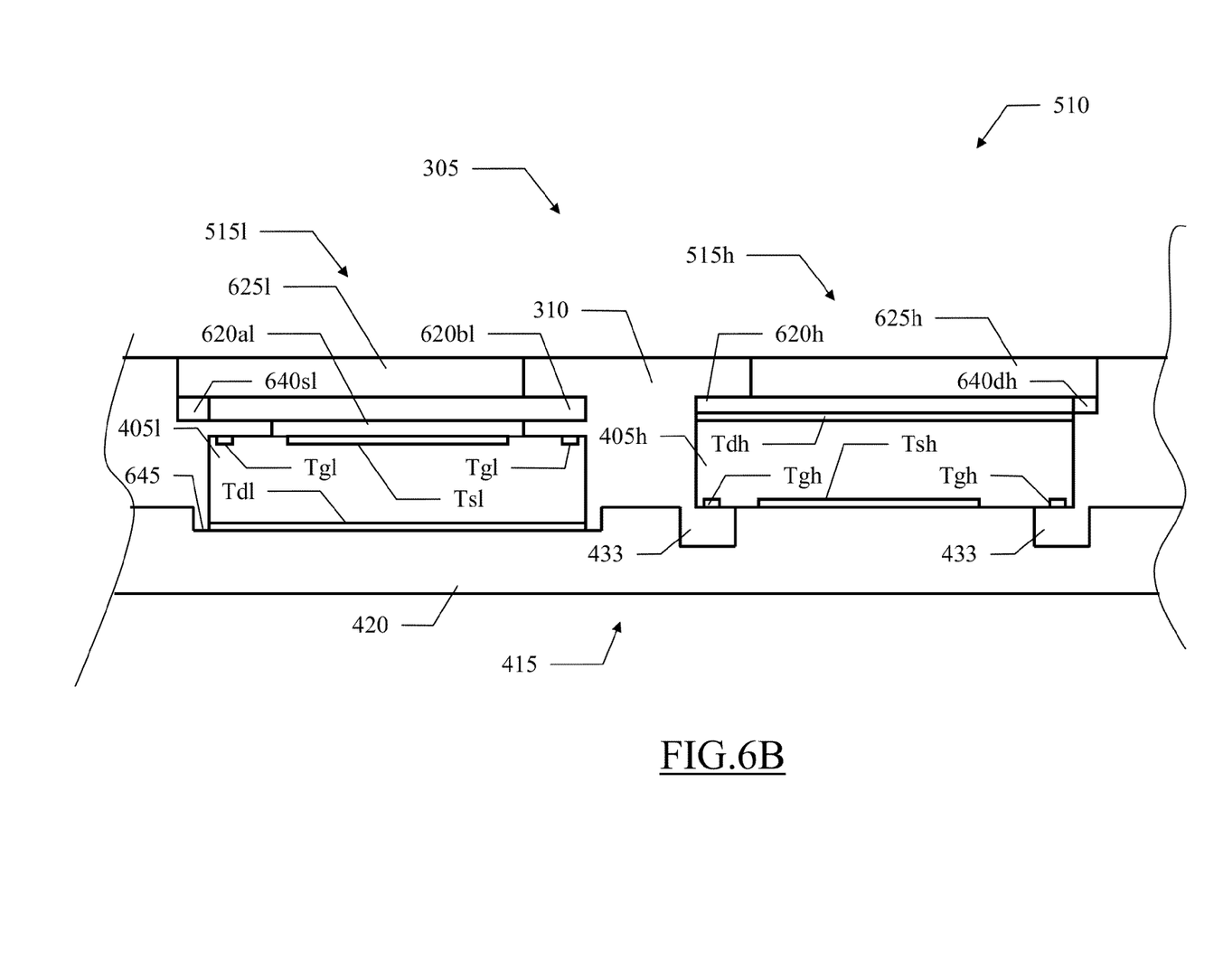

A phantom perspective view from the top and a partial cross-section side view of such electronic device 510 according to an embodiment are shown in the FIG. 6A-FIG. 6B, respectively.

With reference in particular to the FIG. 6A, the heat sink 515*l* is formed by a plate 620*a* of generically rectangular shape, which extends in plant over and around the source terminal (not visible in the figure) up to near the auxiliary source terminal Tsla and the gate terminal Tgl (without reaching them). The plate 620*a* is surmounted by a further plate 620*bl* of generically rectangular shape with a slightly larger size, which projects beyond the plate 620*a* from three edges thereof (with the exception of the one at the side of the terminals Tsla and Tgl) up to reaching the corresponding edges of the chip 405*l* in plant, but remaining spaced apart from an underlying portion of the gate terminal Tgl. The heat sink 415*l* also comprises a splint 625*l* extending from the plate 620*bl* upwards (at the opposite side of the chip 405*l*); the splint 625*l* has a size analogous to the one of the plate 620*bl*, but it is slightly misaligned therewith so as to project beyond its edge being distal from the chip 405*h* (i.e., to the left in the figure). The heat sink 515*l* is completely embedded in the insulating body 310, with the exception of a free surface of its splint 625*l* (so as to offer a large surface for the transfer of the heat produced by the chip 405*l* to the outside, but at the same time guaranteeing a good adhesion of the insulating body 310 to the heat sink 515*l*).

The plate 620*a* is fastened to the source terminal (for example, soldered), so as to be electrically connected thereto; a cantilever 640*sl* of electrically conductive material (for example, of metallic material) extends at the side of the plate 620*bl* towards the corresponding socket 435*sl* (with the same thickness). The cantilever 640*sl* ends with a turret turned downwards down to reaching the connection pad of the socket 435*sl*; the turret of the cantilever 640*sl* is fastened (for example, soldered) on the connection pad of the socket 435*sl* (so as to electrically connect the source terminal to the source lead Lsl).

The heat sink 515*h* is instead formed by a single plate 620*h* of generically rectangular shape, which has a width substantially equal to the one of the plates 620*a* and 620*bl*, and a length substantially equal to the one of the chip 405*h*; the plate 620*h* is substantially aligned in plant with three edges of the chip 405*h* (with the exception of the one facing the leads Lsl, Lsla, Lgl, Lgh and Ldh). The heat sink 515*h* also comprises a splint 625*h* extending from the plate 620*h* upwards (at the opposite side of the chip 405*h*); the splint 625*h* has a size analogous to the one of the plate 620*h*, but it is slightly misaligned therewith so as to project beyond its edge being distal from the chip 405*l* (i.e., to the right in the figure). The heat sink 415*h* is completely embedded in the insulating body 310, with the exception of a free surface of its splint 625*h* (so as to offer a large surface for the transfer of the heat produced by the chip 405*h* to the outside, but at the same time guaranteeing a good adhesion of the insulating body 310 to the heat sink 515*h*).

The plate 620*h* is fastened to the drain terminal Tdh (for example, soldered), so as to be electrically connected thereto; a cantilever 640*dh* of electrically conductive material (for example, of metallic material) extends at the side of the plate 620*h* (with the same thickness) towards the corresponding socket 435*dh*. The cantilever 640*dh* ends with a turret turned downwards down to reaching the connection pad of the socket 435*dh*; the turret of the cantilever 640*dh* is fastened (for example, soldered) on the connection pad of the socket 435*dh* (so as to electrically connect the drain terminal Tdh to the drain lead Ldh).

As a further improvement, a depression 645 is formed in the upper part of the plate 420 (of the heat sink 415) in front of the chip 405*l*. As visible more clearly in the FIG. 6B, the depression 645 has a section matching the largest chip that may be mounted on the plate 420 (larger than the chip 405*l* in the example in issue), and a depth equal to a fraction of the height thereof (for example, 0.1-0.3 mm). A lower portion of the chip 405*l* is housed in the depression 645, so that the chip 405*l* projects to a lower extent over the heat sink 415 (with respect to the chip 405*h*).

This allows obtaining a limited thickness of the entire package 305 (for example, lower than 0.9-1 mm) by maintaining unchanged the heat sink 515*l*; indeed, the thickness of the heat sink 515*l* should be sufficiently high to provide a good heat dissipation but guaranteeing the necessary electrical insulation from the gate terminal Tgl (and the mechanical reliability of the structure used to obtain such electrical insulation). Therefore, in this way the limited thickness of the package 305 is obtained without any negative impact on the heat sink 515*l*. The heat sink 515*h* should instead have a lower thickness (to compensate the greater height of the chip 405*h* over the heat sink 415); this does not constitute a problem in general, since the heat sink 515*h* has a more compact structure (since there is no need of insulating it from the drain terminal Tdh).

In order to further reduce the thickness of the package 210, it is also possible to form a further depression (not shown in the figure) in the lower part of the plate 620*h* in front of the chip 405*h*; the depression has a section matching the largest chip 405*h* that may be mounted on the plate 420, and a depth equal to a desired increment of depth of the depression 433, and therefore a desired reduction of thickness of the device 210 (for example, 0.1-0.3 mm)—with an upper portion of the chip 405*h* that is housed in such depression. The reduction of thickness of the plate 620*h* thus obtained also reduces the thermal resistance from the chip 405*h* to the splint 625*h*, without reducing the thermal capacity and the mechanical strength of the entire heat sink 515*h*.

Figure 7:
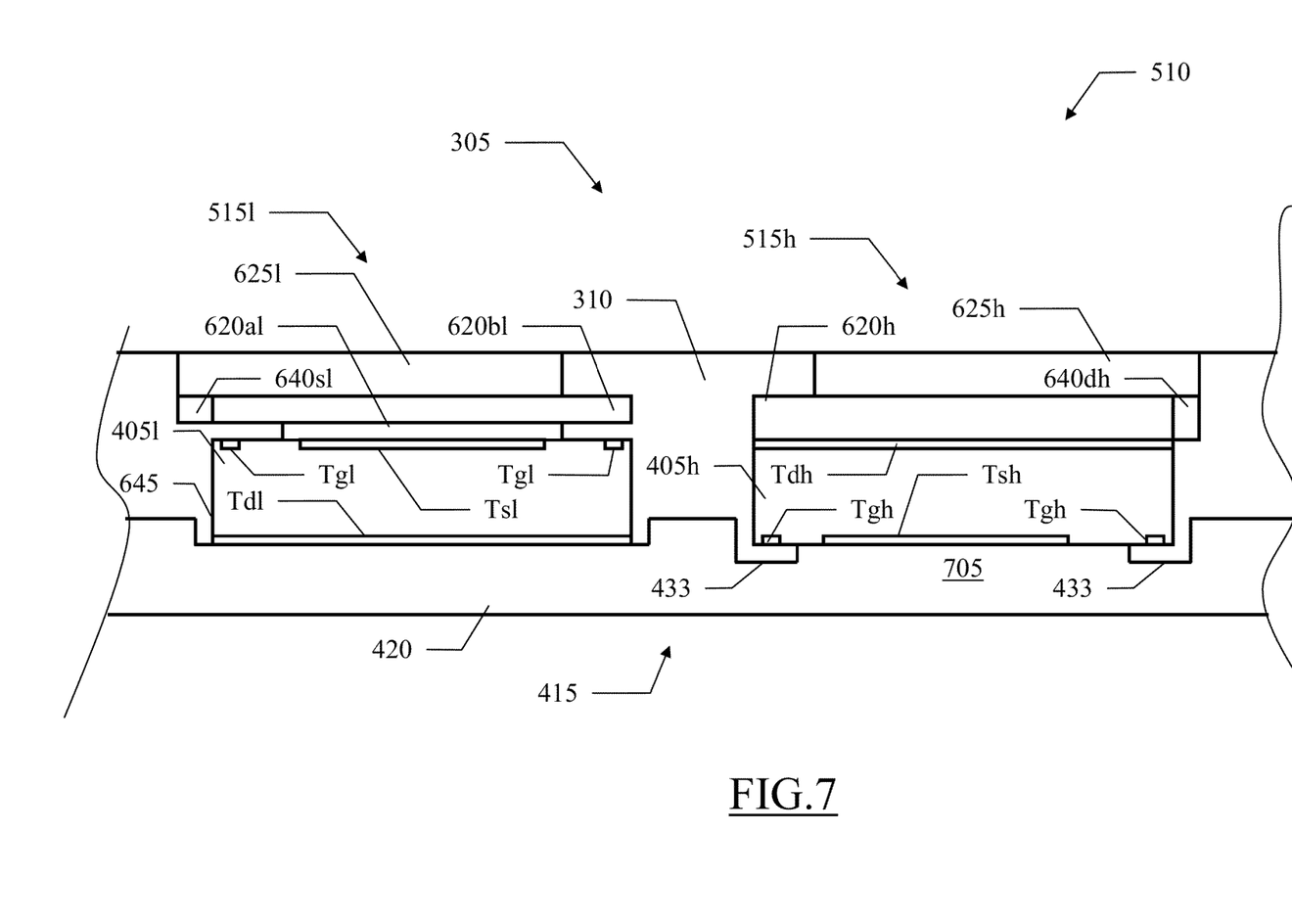
FIG. 7 shows a partial cross-section side view of such electronic device according to a different embodiment.

Alternatively, as shown in the partial cross-section side view of the same electronic device 510 according to a different embodiment in FIG. 7, a platform 705 being delimited in the plate 420 (of the heat sink 415) by the groove 433 is lowered (so as to be sunken therein); particularly, the distance between an upper surface of the platform 705 and the upper surface of the plate 420 is equal to a depth of the depression 645. In this way, the chip 405*h* (rested on the platform 705 with a lateral portion thereof that projects over the groove 433) is at the same height of the chip 405*l* over the heat sink 415; therefore, the heat sink 515*h* may now have the same thickness of the heat sink 515*l* (nevertheless maintaining limited the thickness of the insulating body 310 of the package 305).

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

Moreover, the terms include, comprise, have and contain (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variable involved), and the term a/an should be intended as one or more items (unless expressly indicated otherwise).

For example, similar considerations apply if the electronic device has a different structure or comprises equivalent components, or it has other operative characteristics. In any case, every component thereof may be separated into more elements, or two or more components may be combined together into a single element; moreover, each component may be replicated to support the execution of the corresponding operations in parallel. It is also pointed out that (unless specified otherwise) any interaction between different components generally does not need to be continuous, and it may be either direct or indirect through one or more intermediaries.

Particularly, the operative voltages and/or currents of the electronic device and its creepage distances are merely indicative; more generally, the same solution lends itself to be applied to any electronic device wherein a main heat sink is required on the mounting surface of its insulating body to facilitate the transfer of the heat produced by the chips to the printed circuit board (or more generally, to any other substrate on which the package may be mounted). The low-side transistor and the high-side transistor may be replaced by any other equivalent element adapted to operate as an electronic switch (for example, BJT/IGBT transistors), having a first conduction terminal (for example, an emitter terminal), a control terminal (for example, a base/gate terminal) and a second conduction terminal (for example, a collector terminal). The (common) package may be of any other type and made of any other electrically insulating material (for example, of ceramic type); similar considerations apply to the shape and to the material of the main heat sink, and to the fastening of the chips thereon (for example, through electrically conductive adhesive).

In any case, the same solution is also applicable by turning upside down the chip of the low-side transistor (instead of the chip of the high-side transistor)—for example, in a half-bridge based on PMOS transistors wherein the source terminal of the low-side transistor is connected to the drain terminal of the high-side transistor through the main heat sink.

The lateral hollow of the main heat sink may have different shape and/or size; in any case, the possibility is not excluded of making the main heat sink with a shape (for example, L-like) extending only in correspondence to the source terminal of the high-side transistor (instead leaving its gate terminal free).

The same structure described above may be used in electronic devices of other type, also not of SMT type—for example, of through-hole technology type, wherein the leads project from the insulating body downwards in order to be inserted into plated through-holes of the printed circuit board from a main surface thereof and soldered to pads on an opposite surface thereof. Moreover, it is also possible to provide alternative and/or additional leads (for example, without any auxiliary source lead).

The terminals of the chips may be connected to the corresponding leads of the package in any other way (for example, with wires, cantilevers, tapes, and any combination thereof) in both the above-described embodiments.

The groove formed on the main heat sink (for insulating the gate terminal of the high-side transistor therefrom) may have any other shape and/or size (according to the pattern of the gate terminal of the high-side transistor); in any case, such groove may also be omitted when the gate terminal of the high-side transistor has a structure such as to be already insulated from the main heat sink (for example, if only formed by the connection pad).

Consequently, the platform defined by the above-mentioned groove will have a corresponding different shape and/or size; moreover, such platform may be at any other depth within the main heat sink (even different of the depth of the depression for the chip of the low-side transistor). In addition or in alternative, as already indicated above, it is also possible to make a depression in the auxiliary heat sink over the chip of the high-side transistor (to compensate its greater height with respect to the chip of the low-side transistor).

The auxiliary heat sinks may be made with any other shape and/or material (or they may also be completely missing), and they may be fastened on the chips in different way.

In this case as well, the drain terminal of the low-side transistor and the source terminal of the high-side transistor may be connected to the corresponding leads of the package independently from the respective auxiliary heat sinks. In any case, nothing prevents having the auxiliary heat sinks electrically insulated from the terminals of the corresponding chips.

The auxiliary heat sink for the chip of the low-side transistor may have any other configuration adapted to insulate the gate terminal of the low-side transistor therefrom (for example, with a corresponding groove following its pattern); in any case, such auxiliary heat sink may also be of flat type (like the auxiliary heat sink for the chip of the high-side transistor) when the gate terminal of the low-side transistor has a structure such as to be already isolated therefrom (for example, if only formed by the connection pad).

The depression in the main heat sink that houses the chip of the low-side transistor may have any other shape, size and/or depth.

In any case, nothing prevents maintaining the chip for the low-side transistor and the chip for the high-side transistor at different heights also in the electronic device not of the DSC type, or on the contrary maintaining both of them flush with the upper surface of the main heat sink (without any depression of the platform for the chip of the low-side transistor and without any depression for the chip of the high-side transistor) in the electronic device of the DSC type—for example, when the auxiliary heat sink is thinner, or it is acceptable a greater thickness of the package.

The above-described electronic device lends itself to be used in any other switching system (for example, of half-bridge type with a single electronic device).

Likewise, the switching system (comprising any number of such electronic devices) lends itself to be used in any other complex system—for example, a power supply, an oscillator, an inverter or a power amplifier.

Similar considerations apply if the same solution is implemented with an equivalent method (by using similar steps with the same functions of more steps or portions thereof, removing some steps being non-essential, or adding further optional steps); moreover, the steps may be performed in a different order, concurrently or in an interleaved way (at least in part).

What is claimed is:

1. An electronic device, comprising:
    a first electronic switch and a second electronic switch, each switch integrated on a chip having a back surface and an opposite front surface, each chip including a first conduction terminal and a control terminal of the switch on the front surface and a second conduction terminal of the switch on the back surface, wherein the first electronic switch and the second electronic switch are connected in a half-bridge configuration with the second conduction terminal of the first electronic switch connected to the first conduction terminal of the second electronic switch;
    a common package comprising an insulating body having a mounting surface and a free surface opposite the mounting surface, the insulating body embedding the chips for the first electronic switch and the second electronic switch, and comprising:
        a heat sink embedded in the insulating body with a portion exposed therefrom on the mounting surface, wherein the heat sink further comprises a depression housing a portion of the chip of the first electronic switch extending from the back surface thereof; and
        a further first heat sink and a further second heat sink each one embedded in the insulating body with a portion exposed therefrom on the free surface, the further first heat sink being mounted on the chip of the first electronic switch in correspondence to the front surface thereof and the further second heat sink being mounted on the chip of the second electronic switch in correspondence to the back surface thereof;
    wherein the chip of the first electronic switch and the chip of the second electronic switch are mounted on the heat sink in correspondence to the back surface and to the front surface, respectively, with the second conduction terminal of the first electronic switch and the first conduction terminal of the second electronic switch in contact with the heat sink so as to be connected electrically therebetween through the heat sink.

2. The electronic device according to claim 1, wherein the heat sink comprises a conductive plate with a lateral hollow, at least one portion of the control terminal of the second electronic switch being arranged in correspondence to the lateral hollow so as to be insulated from the heat sink.

3. The electronic device according to claim 1, wherein the exposed portion of the heat sink defines an output lead of the electronic device that is connected to the second conduction terminal of the first electronic switch and to the first conduction terminal of the second electronic switch, the package comprising a first conduction lead, a second conduction lead, a first control lead and a second control lead of the electronic device exposed from the insulating body at least on the mounting surface, and further comprising a connection of the first conduction terminal of the first electronic switch to the first conduction lead, a connection of the second conduction terminal of the second electronic switch to the second conduction lead, a connection of the control terminal of the first electronic switch to the first control lead, and a connection of the control terminal of the second electronic switch to the second control lead.

4. The electronic device according to claim 3, wherein each pair of leads are spaced apart by at least a corresponding creepage distance along the insulating body.

5. An electronic device, comprising:
    a first electronic switch and a second electronic switch, each switch integrated on a chip having a back surface and an opposite front surface, each chip including a first conduction terminal and a control terminal of the switch on the front surface and a second conduction terminal of the switch on the back surface, wherein the first electronic switch and the second electronic switch are connected in a half-bridge configuration with the second conduction terminal of the first electronic switch connected to the first conduction terminal of the second electronic switch;
    a common package comprising an insulating body having a mounting surface and a free surface opposite the mounting surface, the insulating body embedding the chips for the first electronic switch and the second electronic switch, and comprising a heat sink embedded in the insulating body with a portion exposed therefrom on the mounting surface, wherein the heat sink comprises tie-bars exposed from a lateral surface of the insulating body between the mounting surface and the free surface, the tie-bars being spaced apart from the further first and second heat sinks and each lead different from the output lead by at least a corresponding creepage distance along the insulating body; and a further first heat sink and a further second heat sink each one embedded in the insulating body with a portion exposed therefrom on the free surface, the further first heat sink being mounted on the chip of the first electronic switch in correspondence to the front surface thereof and the further second heat sink being mounted on the chip of the second electronic switch in correspondence to the back surface thereof;

wherein the chip of the first electronic switch and the chip of the second electronic switch are mounted on the heat sink in correspondence to the back surface and to the front surface, respectively, with the second conduction terminal of the first electronic switch and the first conduction terminal of the second electronic switch in contact with the heat sink so as to be connected electrically therebetween through the heat sink; and wherein the exposed portion of the heat sink defines an output lead of the electronic device that is connected to the second conduction terminal of the first electronic switch and to the first conduction terminal of the second electronic switch, the package comprising a first conduction lead, a second conduction lead, a first control lead and a second control lead of the electronic device exposed from the insulating body at least on the mounting surface, and further comprising a connection of the first conduction terminal of the first electronic switch to the first conduction lead, a connection of the second conduction terminal of the second electronic switch to the second conduction lead, a connection of the control terminal of the first electronic switch to the first control lead, and a connection of the control terminal of the second electronic switch to the second control lead.

6. The electronic device according to claim 3, wherein the heat sink comprises a conductive plate with a lateral hollow, at least one portion of the control terminal of the second electronic switch being arranged in correspondence to the lateral hollow so as to be insulated from the heat sink, and wherein the connection of the control terminal of the second electronic switch to the second control lead comprises a conductive cantilever extending from the second control lead inside the lateral hollow and having a free end connected to the control terminal of the second electronic switch.

7. An electronic device, comprising:
a first electronic switch and a second electronic switch, each switch integrated on a chip having a back surface and an opposite front surface, each chip including a first conduction terminal and a control terminal of the switch on the front surface and a second conduction terminal of the switch on the back surface, wherein the first electronic switch and the second electronic switch are connected in a half-bridge configuration with the second conduction terminal of the first electronic switch connected to the first conduction terminal of the second electronic switch;
a common package comprising an insulating body having a mounting surface and a free surface opposite the mounting surface, the insulating body embedding the chips for the first electronic switch and the second electronic switch, and comprising:
a heat sink embedded in the insulating body with a portion exposed therefrom on the mounting surface, wherein the heat sink comprises a groove in correspondence to at least a further portion of the control terminal of the second electronic switch for insulating said further portion of the control terminal of the second electronic switch from the heat sink; and a further first heat sink and a further second heat sink each one embedded in the insulating body with a portion exposed therefrom on the free surface, the further first heat sink being mounted on the chip of the first electronic switch in correspondence to the front surface thereof and the further second heat sink being mounted on the chip of the second electronic switch in correspondence to the back surface thereof;

wherein the chip of the first electronic switch and the chip of the second electronic switch are mounted on the heat sink in correspondence to the back surface and to the front surface, respectively, with the second conduction terminal of the first electronic switch and the first conduction terminal of the second electronic switch in contact with the heat sink so as to be connected electrically therebetween through the heat sink.

8. The electronic device according to claim 7, wherein a portion of the heat sink delimited by the groove defines a platform sunken into the heat sink, the chip of the second electronic switch resting on the platform with a portion projecting over the groove.

9. The electronic device according to claim 1, wherein the further first heat sink contacts the first conduction terminal of the first electronic switch, the connection of the first conduction terminal of the first electronic switch to the first conduction lead comprising a further first conductive cantilever extending from the further first heat sink and having a free end connected to the first conduction lead, and wherein the further second heat sink contacts the second conduction terminal of the second electronic switch, the connection of the second conduction terminal of the second electronic switch to the second conduction lead comprising a further second conductive cantilever extending from the further second heat sink and having a free end connected to the second conduction lead.

10. The electronic device according to claim 9, wherein the further first heat sink comprises a further first conductive plate contacting the first conduction terminal of the first electronic switch, the further first conductive plate being insulated from the control terminal of the first electronic switch, and a further second conductive plate contacting the further first conductive plate on a free surface opposite the chip of the first electronic switch, the further second conductive plate projecting at least partially beyond the further first conductive plate spaced apart from a corresponding portion of the control terminal of the first electronic switch.

11. An electronic device, comprising:
a first integrated circuit MOSFET switch chip having a front surface defining a first source terminal and a rear surface defining a first drain terminal;
a second integrated circuit MOSFET switch chip having a front surface defining a second source terminal and a rear surface defining a second drain terminal;
a conductive heat sink plate having a top surface, wherein the first integrated circuit MOSFET switch chip is mounted with its front surface in contact with the top surface of the heat sink and the second integrated circuit MOSFET switch chip is mounted with its rear surface in contact with the top surface of the heat sink, said conductive heat sink plate electrically connecting the first source terminal to the second drain terminal;
a gate lead extending through the laterally extending hollow to make electrical contact to gate terminal on the front surface of the first integrated circuit MOSFET switch chip; and a package which embeds the first integrated circuit MOSFET switch chip, the second integrated circuit MOSFET switch chip and the conductive heat sink plate.

12. The device of claim 11, wherein the package includes an opening exposing a portion of a bottom surface of the conductive heat sink plate.

13. The device of claim 11, wherein the conductive heat sink plate includes a laterally extending hollow aligned with a gate terminal on the front surface of the first integrated circuit MOSFET switch chip.

14. The device of claim 11, wherein the heat sink plate includes a groove in correspondence to at least a further portion of the gate terminal for insulating said further portion of the gate terminal from the heat sink.

15. The device of claim 14, wherein a portion of the heat sink delimited by the groove defines a platform sunken into the heat sink, the first integrated circuit MOSFET switch chip resting on the platform with a portion projecting over the groove.

16. The device of claim 11, wherein the package comprises a mounting surface including an opening exposing a portion of a bottom surface of the conductive heat sink plate and a free surface opposite the mounting surface, the device further comprising an additional heat sink embedded within the package, the free surface including an opening exposing a portion of a surface of the additional heat sink.

17. The device of claim 16, wherein said additional heat sink is attached to the rear surface of the first integrated circuit MOSFET switch chip.

18. The device of claim 16, wherein said additional heat sink is attached to the front surface of the second integrated circuit MOSFET switch chip.

19. The device of claim 16, wherein the additional heat sink is in electrical contact with a conduction lead to outside of the package for the first drain terminal.

20. The device of claim 16, wherein the additional heat sink is in electrical contact with a conduction lead to outside of the package for the second source terminal.

21. An electronic device, comprising:
a first switch having a first front surface including a first conduction terminal and a control terminal of the first switch an opposite first back surface including a second conduction terminal of the first switch;
a second electronic switch having a second front surface including a first conduction terminal and a control terminal of the second electronic switch an opposite second back surface including a second conduction terminal of the second electronic switch;
a heat sink having a mounting surface, wherein the first front surface of the first switch is mounted to the mounting surface and the second back surface of the second electronic switch is mounted to the mounting surface, said heat sink electrically connecting the first conduction terminal of the first switch to the second conduction terminal of the second electronic switch in a half-bridge configuration, wherein the heat sink further includes a laterally extending hollow aligned with the control terminal of the first switch, and further comprising a control lead extending through the laterally extending hollow to make electrical contact to control terminal of the first switch; and
a common package for the first and second electronic switches comprising an insulating body embedding the first switch, second electronic switch and heat sink.

22. The electronic device of claim 21, wherein the common package includes an opening exposing a surface of the heat sink opposite the mounting surface.

23. The electronic device of claim 21, further including a first additional heat sink mounted to the first back surface of the first switch, said common package including a first additional opening exposing a surface of the first additional heat sink.

24. The electronic device of claim 21, further including a second additional heat sink mounted to the second front surface of the second electronic switch, said common package including a second additional opening exposing a surface of the second additional heat sink.

* * * * *